United States Patent [19]

Hwang

[11] Patent Number: 5,166,095
[45] Date of Patent: Nov. 24, 1992

[54] LOW CONTACT RESISTANCE PROCESS
[75] Inventor: Stephen Hwang, San Jose, Calif.
[73] Assignee: Samsung Semiconductor, Inc., San Jose, Calif.
[21] Appl. No.: 627,680
[22] Filed: Dec. 14, 1990
[51] Int. Cl.⁵ ............................................. H01L 21/44
[52] U.S. Cl. ..................................... 437/188; 437/187; 437/197; 437/199; 437/957; 437/245; 437/247; 437/248
[58] Field of Search ............... 437/188, 187, 197, 199, 437/957, 248, 247, 245; 148/DIG. 155, 33.6, 33.3

[56] References Cited

U.S. PATENT DOCUMENTS

| | | | |
|---|---|---|---|
| 4,525,221 | 6/1985 | Wu | 437/188 |
| 4,968,644 | 11/1990 | Gallagher et al. | 437/192 |
| 5,019,533 | 5/1991 | Cuddihy et al. | 437/247 |

OTHER PUBLICATIONS

"Semiconductor Contacting with Aluminum", Hagmann, IBM Technical Disclosure Bulletin, vol. 13, No. 10, Mar. 1979; pp. 2911.

*Primary Examiner*—Brian E. Hearn
*Assistant Examiner*—Trung Dang
*Attorney, Agent, or Firm*—Skjerven, Morrill, MacPherson, Franklin & Friel

[57] ABSTRACT

A process to reduce M1/N+ contact resistance includes a low temperature anneal step, after the aluminum interconnect is alloyed at 400° C. During the low temperature anneal step, the temperature of the furnace tube is lowered from 400° C. to 250° C. over a period of two hours, after which the integrated circuit is annealed under nitrogen for a further period of one hour. Alternately, the low temperature anneal is performed in an oven filled with nitrogen for a period of two hours at 250° C.

20 Claims, 7 Drawing Sheets

LOW CONTACT RESISTANCE PROCESS

FIELD OF THE INVENTION

This invention relates to the fabrication of integrated circuits. In particular, this invention relates to the fabrication process for ohmic metal semiconductor interfaces in integrated circuits.

DESCRIPTION OF RELATED ART

It is well known in the art that a reactive ion etch (RIE) used in preparing the surface of a semiconductor for metallization (e.g., aluminum) may damage the surface, resulting in high contact resistance at the semiconductor-metal interface. High contact resistance is undesirable since it reduces circuit speed, which reduces the yield of the manufacturing process.

Diffusion of metal atoms (e.g., aluminum) into the lattice of the silicon substrate is believed to be the cause of high contact resistance. Two of the factors known to affect the amount of metal diffusion into the lattice of the silicon substrate are temperature and damage on the semiconductor surface. In addition, the temperature factor is believed to reinforce the damage factor, because, at the higher temperature, more metal atoms diffuse into the lattice of the silicon substrate due to the higher metal solubility in silicon. The metal atoms diffused into the lattice of the silicon substrate due to the higher solubility will cause further damage to the silicon surface. This further damage to the silicon surface, in turn, facilitates further diffusion of the metal atoms into the silicon.

One factor that determines whether higher contact resistance may result is the metal used in the alloy step. For example, like boron, aluminum is a p-type material. Therefore, if aluminum atoms diffuse into a p+ active region, the p-type impurity concentration of the region is increased so as to reduce contact resistance in the p+/aluminum interface. However, the opposite is true at an n+/aluminum interface. Therefore, when aluminum atoms diffuse into a n+ active region, a thin layer is formed at the aluminum/n+ interface, which behavior is similar to a pn junction. As a result, aluminum/n+ contact resistance is increased.

In the prior art, a non-reactive plasma etch step (called "contact damage removal etch" or "silicon dust etch") is provided after the RIE step to remove up to 300 Å of damaged silicon from the silicon surface before metallization. This plasma etch step can be carried out, for example, using a model 490 plasma etcher available from Lam Research of Fremont, Calif. However, this approach has not been uniformly successful because the depth of damaged silicon varies over a significant range. For any given wafer, it is very difficult to predict the appropriate depth of silicon to remove. If the repair etch is incomplete, the effects of the damaged silicon surface persist. If the repair etch is too much, metal spiking may result to damage the semiconductor regions beneath the silicon surface, and thereby impair proper operation of the semiconductor device.

FIG. 1 shows the temperature versus time graph of an alloy step in a prior art process. The alloy step is typically the last step of wafer fabrication. The metal would have been deposited by sputtering after a "contact etch" step, which provides the connection points to the underlying silicon structure. For convenience, this prior art process will hereinafter be referred to as the "ALLOY2"process. As shown in FIG. 1, the silicon wafer in a furnace tube is kept at 400° C. for ten minutes (time period 10) under nitrogen, after which "forming gas," consisting of 10% (by volume) hydrogen gas carried by nitrogen, is introduced into the furnace tube and the wafer is allowed to react with this mixture for thirty minutes (time period 11). The hydrogen is then purged from the furnace tube, and the wafer is allowed to remain in nitrogen for an additional five minutes(time period 12), at which time the wafer is removed from the 400° C. furnace tube.

SUMMARY OF THE INVENTION

In accordance with the present invention, M1/N+ metal-semiconductor contact resistance of an integrated circuit is reduced by a post-alloy annealing step (the "low temperature anneal") at a temperature lower than that used in the alloy step.

In one embodiment, the present invention is applicable to integrated circuits having aluminum metallization. When aluminum is used, the alloy temperature is about 400° C., and a reduced M1/N+ contact resistance is achieved after an anneal step at a temperature between 250° C. and 300° C.

In another embodiment of the present invention, the same furnace tube is used in both the alloy step and the low temperature anneal step. In this first embodiment, the temperature of the furnace tube is first lowered from the higher alloy temperature to the lower annealing temperature over a first time period, after which the integrated circuit is annealed for a second time period at the lower temperature.

In another embodiment of the present invention, the metallization and the low temperature anneal steps are carried out in different apparatus. In this second embodiment, the semiconductor integrated circuit is annealed in an apparatus separate from that used to form the metal-semiconductor contact, and at a temperature lower than that used in the alloy step.

This invention is better understood upon consideration of the following detailed description in conjunction with the accompanying drawings.

DETAILED DESCRIPTION OF THE PREFERRED EMBODIMENT

Figure 2A:
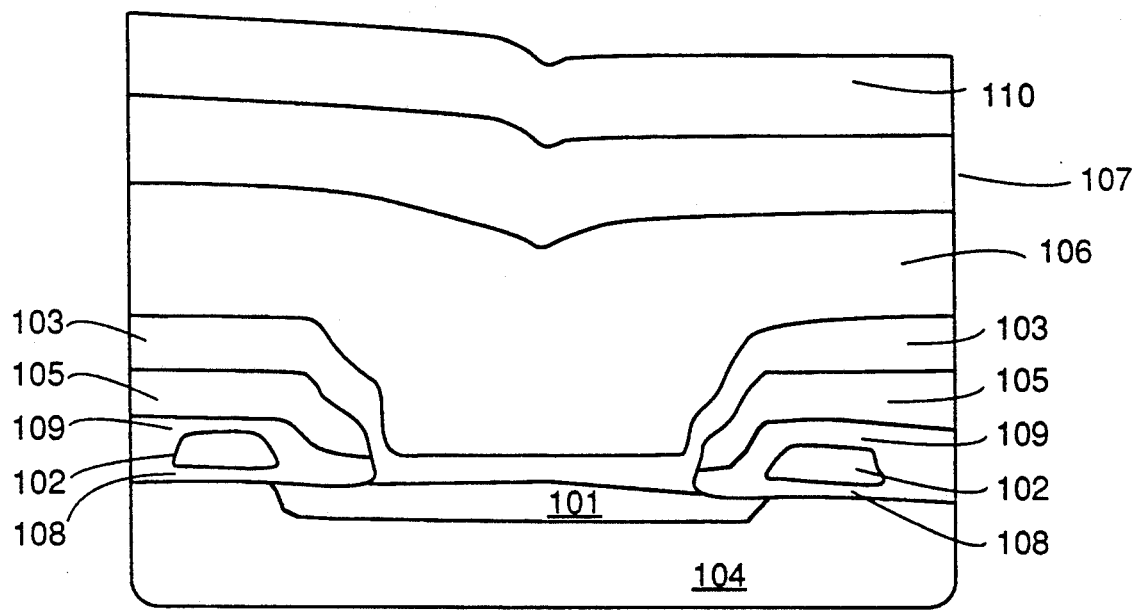
FIGS. 2A and 2B are respectively cross-sections of metal/n+ semiconductor and metal/p+ semiconductor contacts.

FIG. 2A shows a metal/n+ semiconductor contact. As shown, a heavily doped n+ region 101 is formed in a substrate 104. Substrate 104 is a lightly doped semiconductor of either p or n type. In FIG. 2A, this n+ region 101 is formed between two active regions defined by the polycide structures labeled 102 over a gate oxide layer 108. The polycide structures 102 form the gates of two field effect transistors shown here sharing an n+ region 101. A layer of low-temperature oxide 109 provides insulation between the polycide layer 102 and a second polysilicon structure (not shown). A layer 105 of boron phosphorus silicate glass provides a rounded contour for deposition of the first metal layer, which is shown as metal layer 103. Another layer of low temperature oxide 106 is shown on top of metal layer 103. Another layer of phosphorus silicate glass 107 is provided on top of the low temperature oxide layer 106. The surface is then passivated by a layer 110 of plasma nitride. The step of providing the metal line 103 is usually performed late in the manufacturing process, after an etching step, such as a reactive ion etch (RIE), is used to expose the n+ region 101 by selectively etching away the semiconductor structure above the n+ region 101.

The present invention can be used in commercially or generally known NMOS and CMOS processes. It will be appreciated that the fabrication in accordance with the twin well CMOS process sequence described below is illustrative.

In one embodiment, the semiconductor structures are fabricated on an N-type substrate which is cleaned and coated with a thin thermal stress-relief oxide film and a thicker silicon nitride film. A photoresist is deposited, and the photoresist and the underlying silicon nitride and oxide films are patterned and etched. A phosphorus implant is made to obtain the N-well regions of the integrated circuit. The photoresist is removed and the N-well regions are oxidized to provide a P-well mask. The remaining nitride and oxide layers are removed, and a boron implant is made to obtain the P-well regions of the integrated circuit. A stress relief oxide layer and a nitride layer are reformed.

Active areas are defined as follows. The oxide and nitride layers are patterned with a suitable active area mask, a P-field implant is made, and a thermal field oxide is grown between the active areas. A gate oxide (such as layer 108 of FIG. 2A) of about 250 A thickness is formed over the active areas.

Polycide conductive structures (such as layer 102 of FIG. 2A) that function variously as gates, interconnects, and active area contacts are formed as follows. Gate oxide is patterned to form buried layer contact holes to buried contacts. A first polysilicon film of about 3000 A thickness is deposited using any suitable deposition equipment, such as, for example, a LPCVD tube such as available from Thermco Corporation, Los Angeles, at a deposition temperature of 615° C. The first polysilicon film is doped with phosphorus to a sheet resistance of about 17.5 ohms/square using any suitable equipment, such as, for example, a $POCl_3$ tube such as available from Thermco Corporation. Following a deglaz and sulfuric acid clean, a tungsten silicide film of about 2000 A thickness is deposited using any suitable deposition equipment, such as, a CVD reactor available from Genus Corporation, Mountain View, Calif. The target sheet resistance is about 43 ohms/square. The tungsten silicide and polysilicon layers, which are collectively known as polycide, are patterned in accordance with the polycide mask to form conductive structures. An adequate thickness of oxide, such as, for example, about 150 A, is left over all active areas unprotected by the polycide structures. A silicide anneal and re-oxidation step is then performed at 900° C. using a Thermco furnace, which adds about 110 A over the active area.

Source and drain regions (such as n+ region 101) are formed as follows. A 2000 A layer of low temperature oxide is deposited using any suitable equipment, such as a CVD reactor available from Anicon, Inc., San Jose, Calif. The resulting LTO film is anisotropically etched using any suitable equipment, such as, for example, the model 8310 RIE etcher available from Applied Materials, Inc., Santa Clara, Calif. in order to remove all LTO film except for that on the sidewalls of the polycide structures. Sidewall spacers result. A layer of oxide, measuring about 100 A +/− 100A, is left over the active areas unprotected by the polycide structures. The N-well regions are masked by photoresist, and a suitable N-type dopant such as phosphorus, arsenic, or both are implanted into areas of the P-wells not protected by gate structures, their LTO sidewalls, or field oxide. For example, if both phosphorus and arsenic are used, suitable doses and energies include, for the phosphorus implant, doses in the range of 1.5 E14 through 2.5 E14 and energies in the range of 65 KeV through 75 KeV respectively; and for the arsenic implant, doses in the range of 6 E15 through 8 E15 and energies in the range of 60 KeV through 80 KeV respectively. The photoresist is stripped, and new photoresist is deposited to mask the P-well regions. A suitable P-type dopant such as boron difluoride is implanted into areas of the N-wells not protected by gate structures, their LTO sidewalls, or field oxide. Doses in the range of 3 E15 through 6 E15 and energies in the range of 60 KeV through 80 KeV are suitable. The photoresist is stripped.

Second poly ("Poly II") features are fabricated as follows. A layer of LTO (such as layer 109 of FIG. 2A) is deposited at 360° C. to a thickness of about 2000 A using any suitable equipment, such as the previously mentioned anicon CVD reactor. The LTO film is densified in any suitable equipment, such as the previously mentioned Thermco furnace. A mask step is performed at this time to etch contact holes through the LTO layer (e.g. layer 109). A photoresist is patterned, and contact holes are etched through the densified LTO layer using any suitable equipment, such as by plasma etch using the previously mentioned Applied Materials RIE etcher.

Next, a second polysilicon film is deposited to a thickness of about 2000 A using any suitable equipment, such as, for example, the previously mentioned Thermco LPCVD tube. A layer of photoresist is deposited over the second polysilicon layer, and is suitably patterned in accordance with a poly II mask and etched to define second polysilicon features, including sources, drains, and channels of thin film transistors. A suitable etching technique is a plasma poly etch using the Model 490 plasma etcher available from LAM Research Corporation, Fremont, Calif. The remaining portions of the second polysilicon layer are reoxidized to about 150 A thickness, and overlaid by a layer of photoresist which is suitably patterned and etched in accordance with a poly II implant mask expose conductive sections such as prospective source and drain regions of the remaining portions of the second polysilicon layer. A poly II implant is made using any suitable dopant such as, for example, phosphorus at a does of 8.0E15 and an energy of 50 KeV.

First metal features are fabricated as follows. A layer of borophosphosilicate glass ("BPSG") (such as layer 105 of FIG. 2A) is deposited at 400° C. and reflowed to a suitable thickness, which is on the order of from 5500 A to 7000 A. A masking step is followed by various etching steps to make contact holes through the BPSG layer and underlying layers, as desired. A layer of a suitable first metal such as aluminum is deposited to a thickness of, for example, 6500 A and suitably patterned to form interconnect lines.

The metal is deposited by a sputterer, bombarding a metal target with plasma, although other metal deposition processes are also suitable. The metal target can be an ingot comprising 98.5% aluminum, 1% silicon and 0.5% copper. The aluminum which is vaporized by the plasma is deposited on the semiconductor surface. The excess metal is etched away from the semiconductor surface to define the metal lines.

Further processing, such as forming passivation layer 107 or providing additional layers of metallization may thereafter be performed in any suitable manner, provided the temperature in each step does not exceed 400° C. (see below).

To ensure a good ohmic contact at the interface between metal line 100 and the n+ region 101, an alloy step is provided at a sufficiently high temperature, e.g. 400° C. for aluminum. At that temperature, which is below the melting point of the metal, the metal alloys and flows to ensure a maximum and uniform contact area. Forming gas is introduced during this alloy step to eliminate any dangling bonds present on the silicon surface.

Figure 2B:
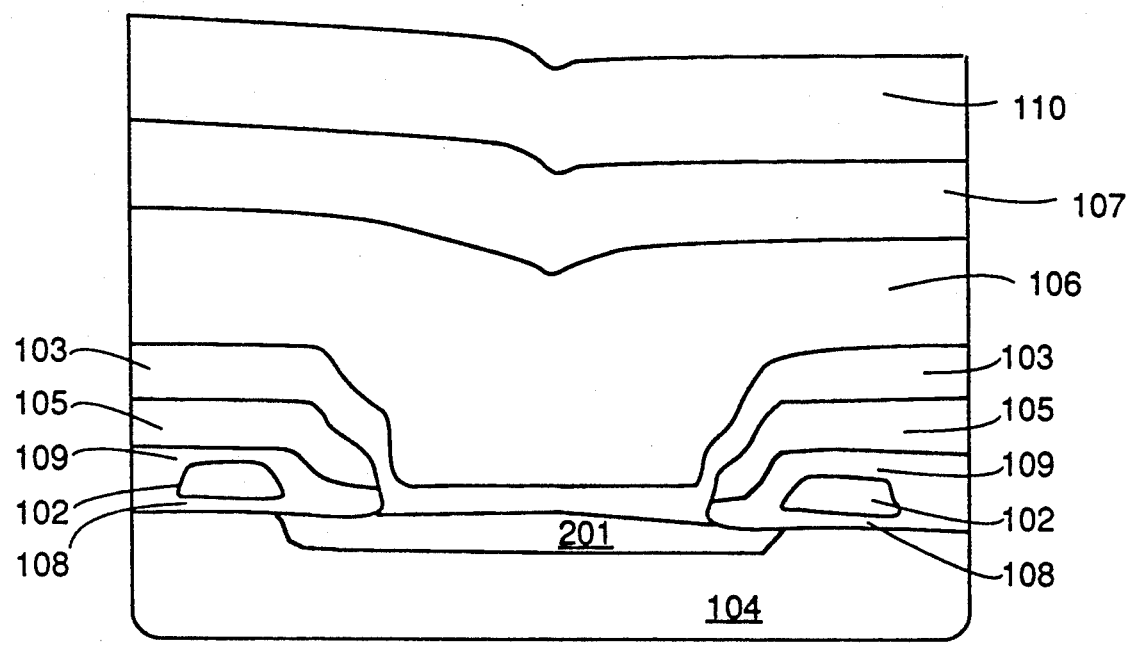

FIG. 2B shows a structure similar to FIG. 2A, having a heavily doped p+ region 201, rather than the n+ region 101 shown in FIG. 2A. The processing steps to achieve the p+/metal contact is already described above in conjunction with FIG. 2A.

In accordance with the present invention, a low temperature anneal step is provided after the alloy step. This low temperature anneal step takes place at a temperature lower than the temperature at which the alloy step takes place. Because solid solubility decreases with temperature, metal atoms are precipitated out of the lattice during this low temperature anneal step. For aluminum, the precipitation of atoms improves the n+/aluminum contact resistance, and raises only slightly the p+/aluminum contact resistance. In order to obtain the full benefit of the present invention, a temperature higher or equal to the temperature of the low temperature anneal step should not be applied to the integrated circuit after the final low temperature anneal step to prevent the precipitated metal atoms from reentering the semiconductor lattice.

Figure 3:
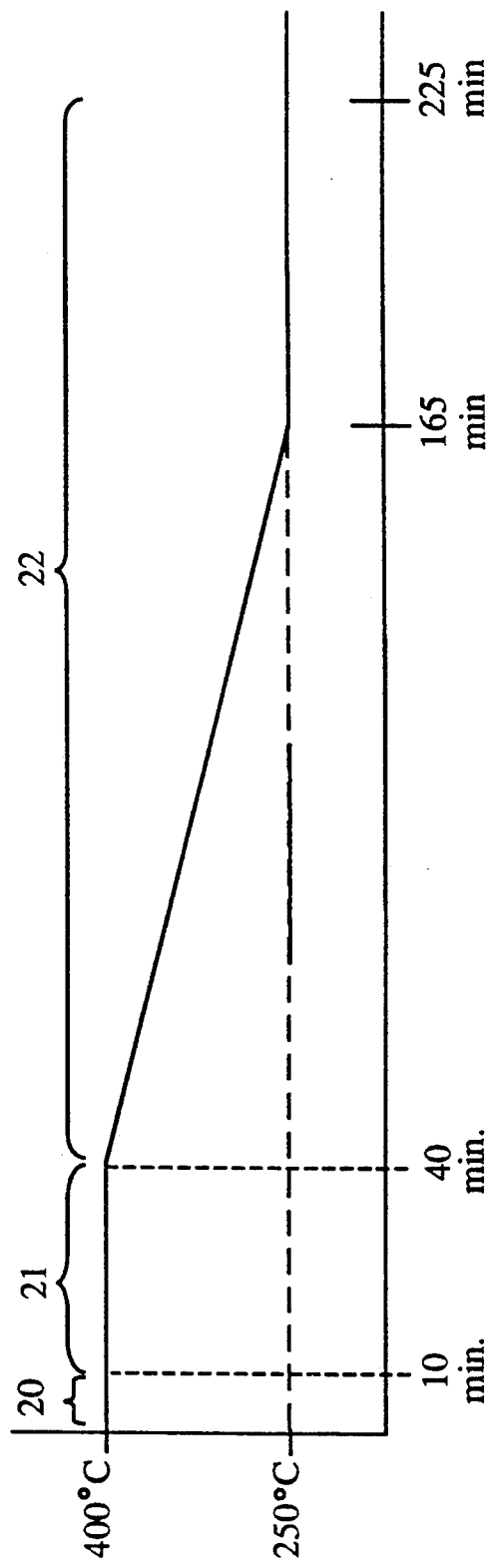
FIG. 3 shows the temperature versus time graph of alloy and post-alloy steps in accordance with the present invention.

FIG. 3 shows the temperature versus time graph of alloy and post-alloy steps in accordance with the present invention. For convenience, the process including the step shown in FIG. 3 will hereinafter be referred to as process "ALLOY3". In ALLOY3, when the wafer is first placed inside the 400° C. furnace, it remains under nitrogen for ten minutes (time period 20); thereafter, hydrogen (10% by volume, carried by nitrogen) is introduced into the furnace tube for thirty minutes (time period 21). At the end of time period 21, nitrogen is introduced into the furnace tube to purge the hydrogen. Then, the wafer is allowed to anneal in the furnace tube at a low temperature for three hours (time period 22) in accordance with the present invention. During this three-hour period, the temperature of the furnace tube is allowed to drop in a controlled manner from 400° C. to 250° C. over a period of two hours, after which the temperature of the furnace is held steady at 250° C. for one hour.

Figure 4:
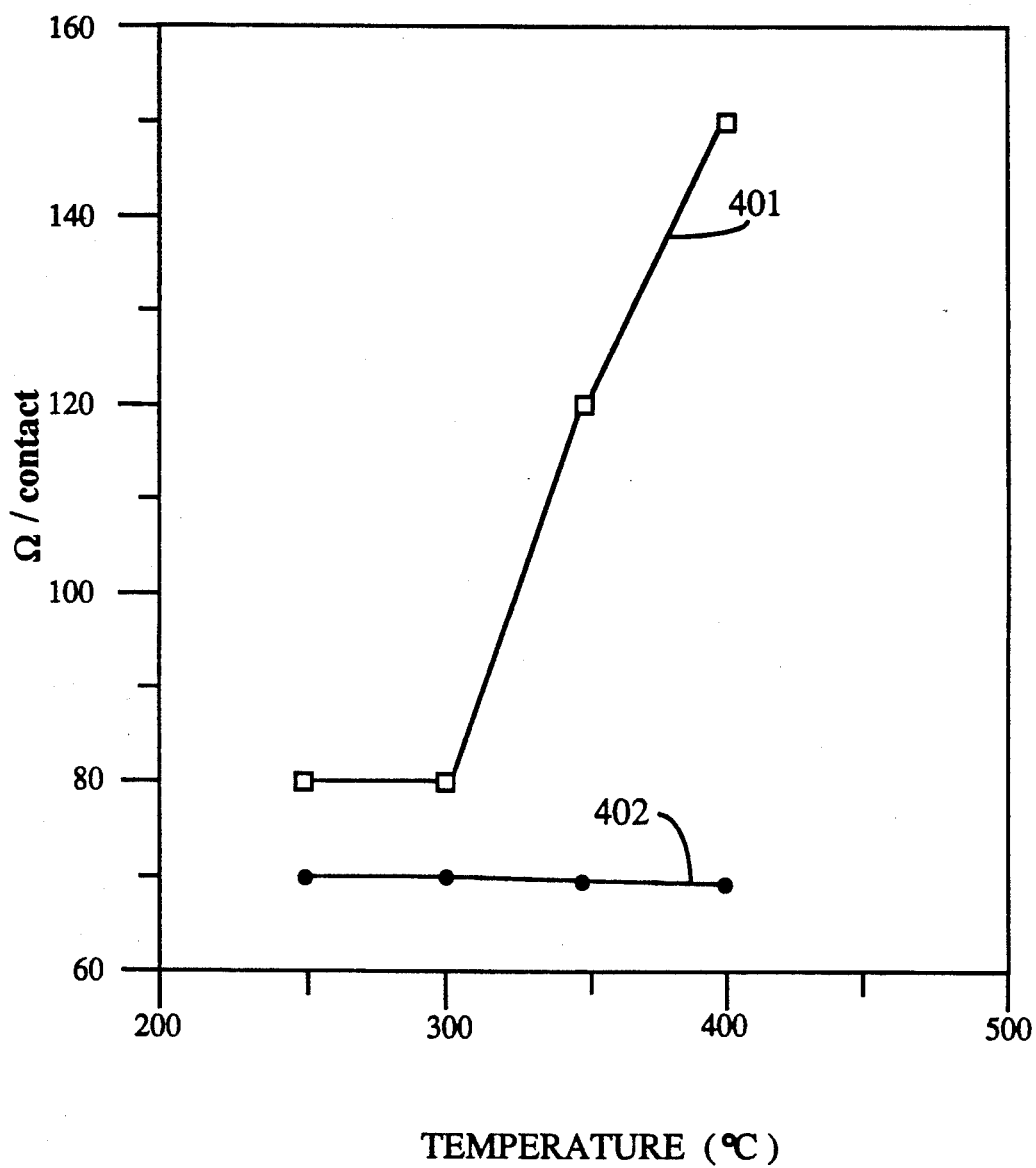
FIG. 4 shows contact resistance graphs for M1/N+ and M1/P+ contacts of a wafer alloyed at 400° C., subject to three two-hour annealing periods in a furnace tube under nitrogen at, respectively, 350° C., 300° C. and 250° C.

Several experiments were conducted to determine the range of suitable temperature-time profiles for the low temperature anneal. FIG. 4 shows the change in contact resistance of a wafer subject to three consecutive two-hour periods of annealing in a furnace tube under nitrogen at temperatures 350° C., 300° C. and 250° C. respectively. Contact resistances at a p+/aluminum contact region ("M1/P+"), and at a n+/aluminum contact region ("M1/N+") are measured after each two-hour period of anneal. As shown in FIG. 3, the M1/N+ contact resistance (represented by graph segment 401), which measured 152±17.3 ohms when the alloy step was completed at 400° C., fell to 109±8.7 ohms after two hours of anneal at 350° C., and further decreased to 78.4±5.5 ohms after the next two hours of annealing at 300° C. A further two hours of anneal at 250° C. did not change the M1/N+ contact resistance. During the three two-hour periods, the M1/P+ contact resistance (represented by graph segment 402) rose slightly from 68.3±2.9 ohms to 69.0±3.5 after two hours at 350° C., and then to 70.7±3.7 ohms after the next two hours of anneal at 300° C., and to 71.4±3.6 ohms after the final two-hour anneal period at 250° C.

Figure 5:
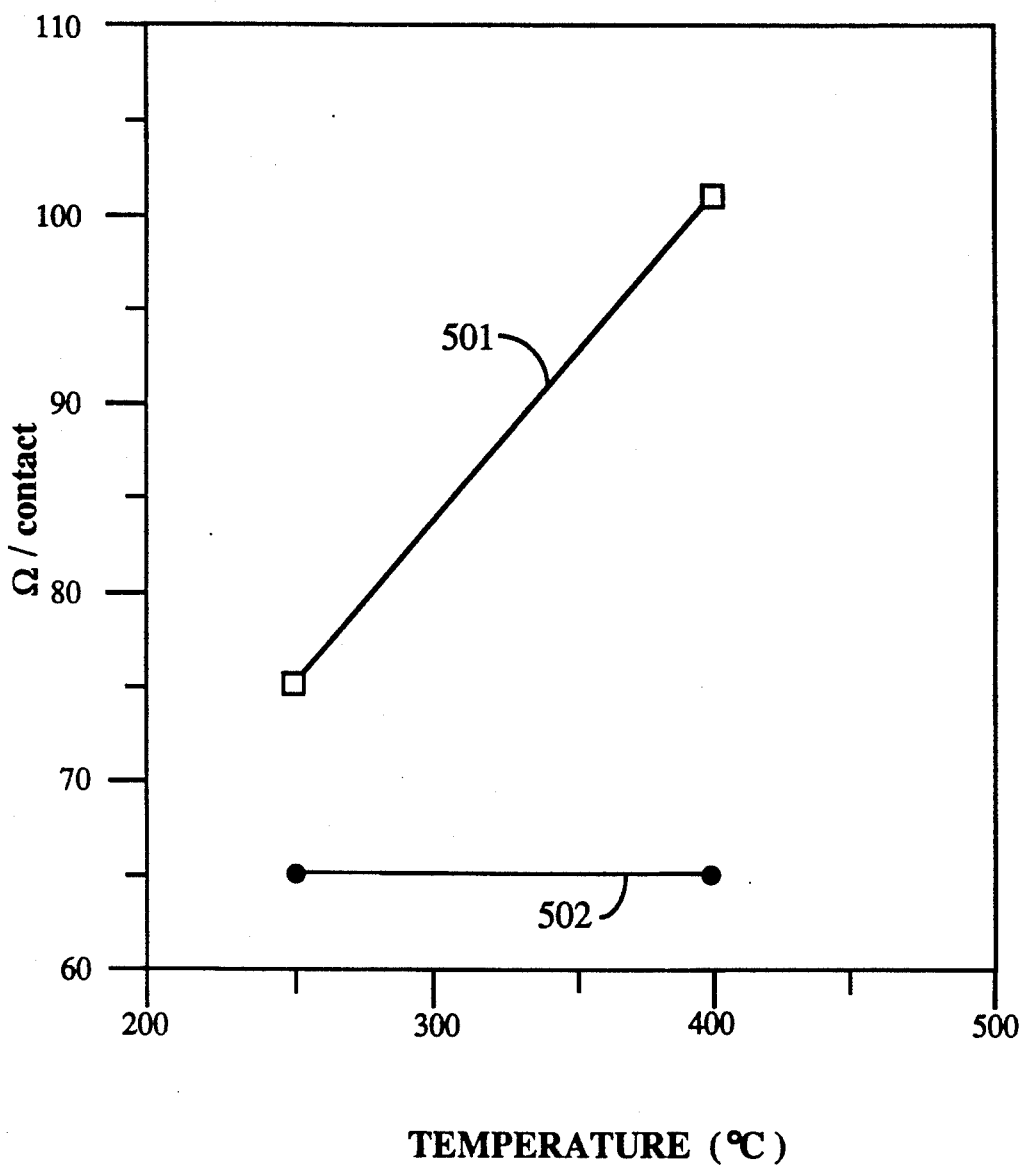
FIG. 5 shows contact resistance graphs for M1/N+ and M1/P+ contacts of a wafer alloyed at 400° C., subject to a two-hour anneal step in a furnace tube under nitrogen at 250° C.

FIG. 5 shows the change in contact resistances of a wafer removed to a 250° C. furnace tube for a two-hour period of anneal in nitrogen, directly after an alloy step at 400° C. As shown in FIG. 4, the M1/N+ contact resistance (represented by graph segment 501) is reduced from 101.5±7.4 ohms to 73.9±3.3 ohms after two hours of anneal in nitrogen at 250° C. The corresponding M1/P+ resistance (represented by graph segment 502) rose slightly from 63.0±0.4 ohms to 63.9±0.6 ohms. Because the final contact resistance achieved in this wafer shown in FIG. 5 is comparable to that of the wafer shown in FIG. 4, which is annealed at successively lower temperatures, any effect due to the history of annealing is believed to be minimal.

In view of the results shown in FIGS. 4 and 5, the final contact resistance is believed to be determined primarily by the final anneal temperature. Hence, wafers need not be subjected to an anneal step immediately after the period of alloy, but may be stored after the period of alloy, at room temperature if desired, for an indeterminate time, and thereafter subjected to an anneal step.

Figure 1:
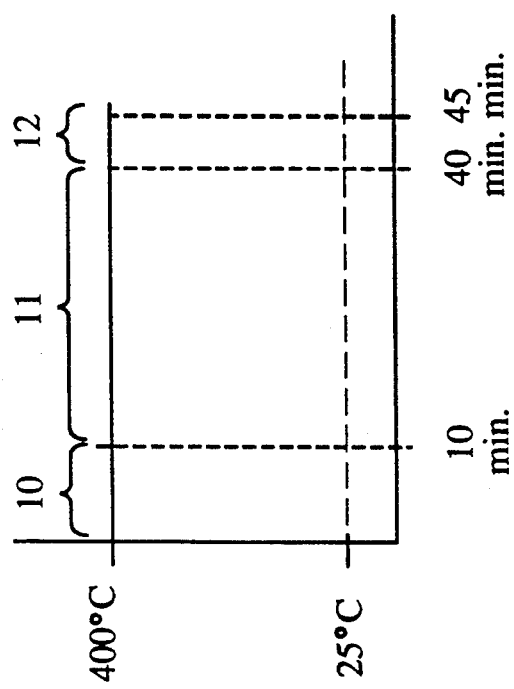
FIG. 1 shows the temperature versus time graph during an alloy step in the prior art.
Figure 6:
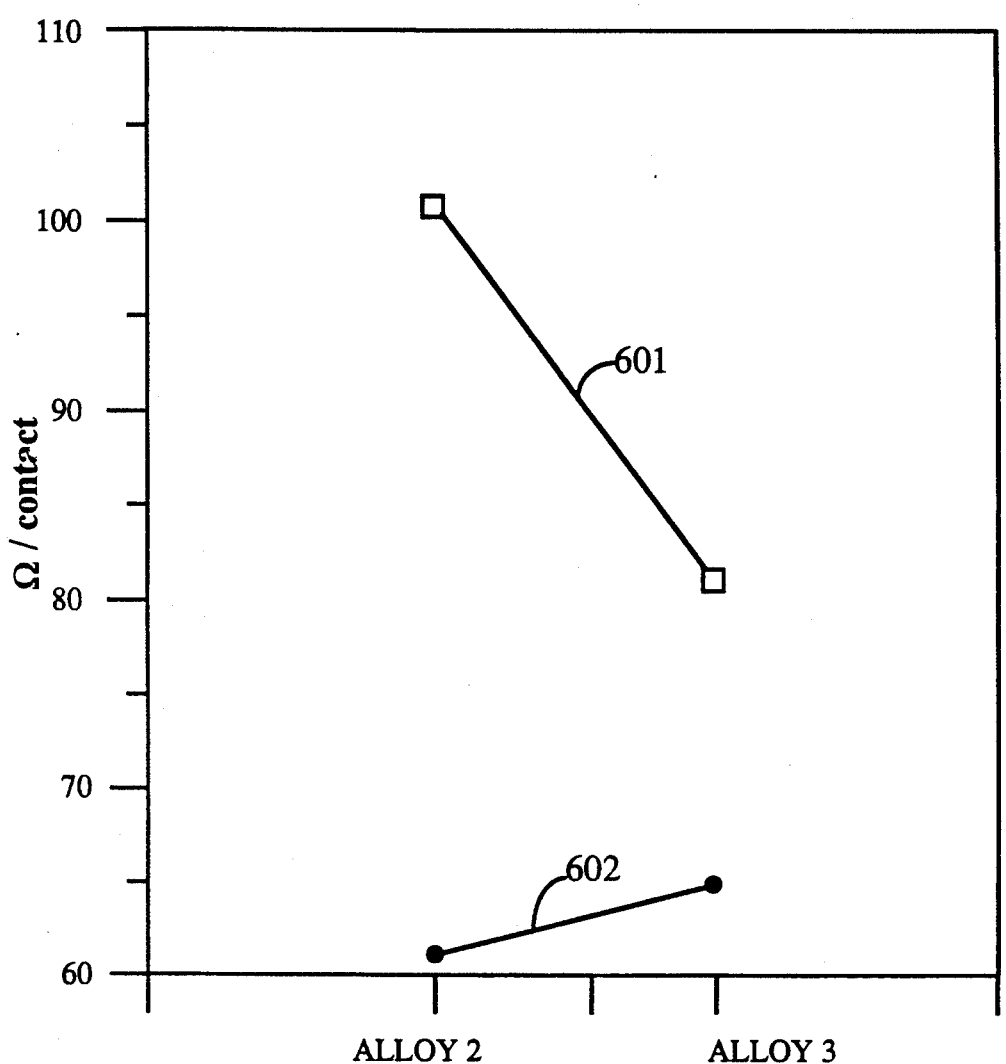
FIG. 6 shows contact resistance graphs for M1/N+ and M1/P+ contacts of a wafer under the process of FIG. 2.

FIG. 6 compares contact resistances of wafers under the ALLOY2 process and ALLOY3 process. In accordance with the ALLOY2 process shown in FIG. 1, a wafer is taken out of the 400° C. furnace tube at the end of time period 12, which is five minutes after hydrogen is purged from the furnace tube. For this wafer, the M1/N+ resistance (represented by graph segment 601) is measured at 100±10.2 ohms, and the M1/P+ contact resistance (represented by graph segment 602) is measured at 62.6±0.6 ohms. In accordance with the ALLOY3 process shown in FIG. 3, however, another similar wafer is allowed to remain in the furnace tube as the temperature is reduced to 250° C. over a two-hour period, and thereafter to anneal further in nitrogen at 250° C. for one hour. After the low temperature anneal the M1/N+ contact resistance in this latter wafer is measured at 81.2±4.2 ohms and the M1/P+ resistance is measured at 65.7±1.1 ohms.

Hence, the M1/N+ contact resistance is significantly affected by the final temperature of anneal. The optimal anneal temperature is believed to be in the range of about 250° C. to about 300° C. This low temperature anneal step increases only slightly M1/P+ contact resistance.

The improvement of M1/N+ contact resistance leads to higher yield. Table 1 below shows the yield improvement achieved in a number of wafers having significant numbers of failing dies prior to the anneal step. In Table 1, bin 1 dies have their electrical parameter values within specification limits. Bin 8 dies are each found to be defective because the voltage at an output pad of the die exceeds a predetermined voltage (e.g. 0.3 volts) when a logic low output is required. High contact resistance at an n+/metal interface in the output transistor can lead to a bin 8 failure. It is seen that, after the low temperature anneal step, the number of dies in bin 1 (acceptable dies) is increased, while the number of dies in bin 8 (failing dies) is decreased significantly. The overall yield in this group of wafer improves from 33.1% to 53.5%.

TABLE 1

| Wf# | Original Yield | | After low temp anneal | |
|---|---|---|---|---|
| | Bin 1 | Bin 8 | Bin 1 | Bin 8 |
| 2 | 38 | 25 | 77 | 2 |
| 3 | 56 | 25 | 58 | 5 |
| 7 | 64 | 34 | 99 | 1 |
| 8 | 41 | 39 | 87 | 0 |
| Ave.(DPW) | 49.8 | | 80.3 | |
| Yield | 33.1% | | 53.5% | |

Table 2 below shows that the low temperature anneal step has no adverse effect on wafers having good bin 1 yield prior to the low temperature anneal step.

TABLE 2

| Wf# | Original Yield | | After low temp anneal | |
|---|---|---|---|---|
| | Bin 1 | Bin 8 | Bin 1 | Bin 8 |
| 13 | 88 | 1 | 87 | 0 |
| 18 | 57 | 1 | 57 | 1 |

A second embodiment of the present invention provides the low temperature anneal step not in a furnace tube, but in an oven away from the furnace tube in which the alloy step is carried out. Unlike the low temperature anneal step of ALLOY3, which is carried out in the furnace tube, the second embodiment performs the low temperature anneal step in an oven. In this second embodiment, the wafer is placed in an oven at 250° C. for two hours under nitrogen at a later time, which is not necessarily immediately after the alloy step. For example, the wafer may be stored at room temperature for more than one day before being placed in an oven at 250° C. for the anneal step. Under this method, since the oven is not required to be ramped from a higher 400° C. to the lower anneal temperature of 250° C., the throughput time is shorter than process ALLOY3. Further, since immediate processing is not necessary, this method allows the oven to be located on the test floor, rather than in the fabrication facility. The low temperature anneal step under this second embodiment may therefore be selectively applied only to those wafer found having significant numbers of failing dies during wafer sort or testing.

TABLE 3

| | WAFER 1 | | |
|---|---|---|---|
| | Final wf(400° C.) | 250° C. | 150° C. |
| M1/N+ | 84.1 | 63.8 | 64.6 |
| M1/P+ | 63.6 | 64.7 | 65.0 |
| | WAFER 2 | | |
| | Final wf(400° C.) | 250° C. | 150° C. |
| M1/N+ | 129.7 | 88.3 | 90.1 |
| M1/P+ | 54.6 | 56.5 | 56.8 |

Table 3 above shows the contact resistances of two wafers each being annealed for two consecutive two-hour periods in an oven at 250° C. and at 150° C. respectively. The M1/N+ and M1/P+ contact resistances are measured prior to the low temperature anneal, after the 250° C. anneal and after the 150° C. anneal steps. As shown in Table 3, the M1/N+ contact resistances of the wafers are reduced after the 250° C. anneal, but are found to rise slightly after the 150° C. anneal. Consistent with the results reported above with respect to low temperature anneal in the furnace tube, the M1/P+ contact resistances in these wafers are also found to rise slightly. This experiment shows that the effect of a low temperature anneal between 150° C. and 250° C. achieved in a furnace in accordance with the first embodiment of the present invention is also achieved in the anneal step in an oven, in accordance with this second embodiment of the present invention.

TABLE 4

| | M1/N+ | | M1/P+ | |
|---|---|---|---|---|
| Wf# | Before | After | Before | After |
| 7 | 87.2 | 67.4 | 60.9 | 61.8 |
| 8 | 111 | 74.7 | 65.6 | 67.3 |
| 12 | 78.0 | 61.5 | 61.9 | 62.9 |
| 14 | 86.4 | 66.4 | 61.6 | 62.7 |

Table 4 shows M1/N+ and M1/p+ contact resistances for four wafers before and after a two-hour period of annealing at 250° C. under nitrogen in an oven. As shown in Table 4, the M1/N+ contact resistances for these wafers are significantly reduced by the low temperature anneal step. As expected, the M1/P+ contact resistance is slightly increased. This experiment also shows that the effects achieved with the first and second embodiments are comparable.

The embodiments discussed in the above detailed description are intended to illustrate the specific embodiments of the present invention and are not intended to limit the scope of the present invention. Numerous modifications and variations are possible within the scope of the present invention. For example, the use of a furnace tube capable of cooling from 400° C. to 250° C. more rapidly than ALLOY3's two hours is a variation within the scope of the present invention. The present invention is defined by the claims set forth below.

I claim:

1. A method for reducing contact resistance in an integrated circuit, comprising the steps of:
   forming a pattern of metallic material over a semiconductor material;

alloying said first pattern of metallic material at a first temperature for a period time substantially longer than one minute; and following said alloying step, annealing said first pattern of metallic material for a predetermined period of time within a temperature range lower than said first temperature, said temperature range being the temperature range at which, after said predetermined period of time, results in substantially minimum contact resistance.

2. A method as in claim 1, wherein said annealing step is carried out in a chamber filled with an inert gas.

3. A method as in claim 2, wherein said inert gas is nitrogen.

4. A method as in claim 1, wherein said metallic material is aluminum.

5. A method as in claim 4, wherein said first temperature is about 400° C. and said temperature range is about 250° C. to 300° C.

6. A method as in claim 1, wherein said predetermined period of time is at least one hour.

7. A method as in claim 1, wherein said annealing step is carried out by maintaining said integrated circuit at a temperature within said temperature range.

8. A method as in claim 1, wherein said alloying and said annealing steps are carried out consecutively in a reaction chamber without removing said integrated circuit from said reaction chamber, and wherein said annealing step further comprises the step of lowering the temperature of said reaction chamber over a second period of time from said first temperature to said second temperature.

9. A method as in claim 1, wherein said alloying step is carried out in a reaction chamber, and said annealing step is carried out in an oven.

10. A method as in claim 1, wherein said integrated circuit is allowed to attain after said alloying step and before said annealing step a temperature below said temperature range.

11. A method for forming an ohmic metal contact to semiconductor material, comprising the steps of:

forming a contact structure having a metallic film overlaying and contacting said semiconductor material at least one position;

subjecting said contact structure to a first temperature for a first predetermined period of time substantially longer than one minute to alloy said metal; and following said first subjecting step, subjecting said contact structure to a second temperature lower than said first temperature for a second predetermined period of time to precipitate metal atoms out of the semiconductor material lattice.

12. A method as in claim 11, wherein said metallic film is aluminum and said semiconductor material is silicon.

13. A method for forming an ohmic metal contact to semiconductor material, comprising the steps of:

forming a contact structure having a metallic film overlaying and contacting said semiconductor material at least two positions, the first of said positions having n-type doped semiconductor material and the second of said positions having p-type doped semiconductor material;

subjecting said contact structure to a first temperature for a first predetermined period of time substantially longer than one minute to alloy said metal; and following said first subjecting step, subjecting said contact structure to a second temperature for a second predetermined period of time to decrease the contact resistance at said first position, and to increase the contact resistance at said second position.

14. A method as in claim 13, wherein the amount by which the contact resistance at said first position is decreased is greater than the amount by which the contact resistance at said second position is increased.

15. A method for forming an ohmic metal contact to semiconductor material, comprising the steps of:

forming a contact structure having an aluminum film overlaying and contacting said semiconductive material at least one position;

subjecting said contact structure to a first temperature for a first predetermined period of time substantially longer than one minute to alloy said aluminum; and following said first subjecting step, subjecting said contact structure to a second temperature in the range of from about 150 degrees C. to about 300 degrees C. for a second predetermined period of time.

16. A method as in claim 15 Wherein:

said first temperature is about 400 degrees C.; and said second temperature is reduced from about 400 degrees C. to about 250 degrees C. in a substantially linear manner for about two hours, and thereafter maintained at about 250 degrees C. for about one hour.

17. A method as in claim 15 wherein:

said first temperature is about 400 degrees C.; and said second temperature is maintained at about 250 degrees C. for at least two hours.

18. A method as in claim 17 wherein said temperature is rapidly reduced from about 400 degrees C. to about 250 degrees C.

19. A method as in claim 17 further comprising the step, after said first subjecting step and prior to said second subjecting step, of subjecting said contact structure to room temperature for a predetermined period.

20. A method as in claim 15 further comprising the step, after said first subjecting step and prior to said second subjecting step, of subjecting said contact structure to room temperature for a predetermined period.

* * * * *